(12) United States Patent
Kim et al.

(10) Patent No.: US 10,910,157 B2
(45) Date of Patent: Feb. 2, 2021

(54) ELECTRONIC COMPONENT

(71) Applicant: SAMSUNG ELECTRO-MECHANICS CO., LTD., Suwon-si (KR)

(72) Inventors: Ho Yoon Kim, Suwon Si (KR); Sang Soo Park, Suwon-Si (KR); Woo Chul Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 73 days.

(21) Appl. No.: 16/195,399

(22) Filed: Nov. 19, 2018

(65) Prior Publication Data
US 2020/0082979 A1   Mar. 12, 2020

(30) Foreign Application Priority Data
Sep. 11, 2018 (KR) ........................ 10-2018-0108164

(51) Int. Cl.
*H01G 2/02* (2006.01)
*H01G 4/30* (2006.01)
*H01G 4/232* (2006.01)
*H01G 4/248* (2006.01)
*H01G 4/002* (2006.01)
(Continued)

(52) U.S. Cl.
CPC ............ *H01G 4/002* (2013.01); *H01G 4/2325* (2013.01); *H01G 4/248* (2013.01); *H01G 4/30* (2013.01); *H01G 4/008* (2013.01); *H01G 4/012* (2013.01); *H01G 4/1227* (2013.01); *H01G 4/1245* (2013.01); *H05K 1/181* (2013.01); *H05K 2201/10015* (2013.01); *H05K 2201/10378* (2013.01); *H05K 2201/2045* (2013.01)

(58) Field of Classification Search
CPC ............ H01G 4/30; H01G 4/232; H01G 4/12; H01G 4/2325; H01G 4/248; H01G 4/228; H01G 4/002; H01G 2/02
USPC ......... 361/301.4, 321.1, 321.2, 306.1, 306.3, 361/321.3
See application file for complete search history.

(56) References Cited

U.S. PATENT DOCUMENTS

2015/0122534 A1    5/2015  Park et al.
2015/0270065 A1*   9/2015  Hattori .................. H01G 2/065
                                                                          174/255
(Continued)

FOREIGN PATENT DOCUMENTS

KR   10-2015-0051668 A   5/2015
KR   10-2016-0055424 A   5/2016

*Primary Examiner* — Arun Ramaswamy
(74) *Attorney, Agent, or Firm* — Morgan, Lewis & Bockius LLP

(57) ABSTRACT

An electronic component includes a multilayer capacitor, including a capacitor body, and a pair of external electrodes disposed on both ends of the capacitor body, respectively, and an interposer, including an interposer body, and a pair of external terminals disposed on both ends of the interposer body, respectively. The external terminals include bonding portions, mounting portions, and connection portions disposed to connect the bonding portions and the mounting portions to each other. Adhesives are provided between the external electrodes and the bonding portion. A height at which the adhesives fall along the connection portions of the external terminals is defined as t and a height of the interposer is defined as T, t/T satisfies $0.04 \leq t/T \leq 0.80$.

19 Claims, 7 Drawing Sheets

(51) Int. Cl.
    *H05K 1/18*     (2006.01)
    *H01G 4/12*     (2006.01)
    *H01G 4/008*     (2006.01)
    *H01G 4/012*     (2006.01)

(56) References Cited

U.S. PATENT DOCUMENTS

2016/0133386 A1     5/2016   Park et al.
2017/0290161 A1*  10/2017  Shimura ................ H01G 4/232

* cited by examiner

ELECTRONIC COMPONENT

CROSS-REFERENCE TO RELATED APPLICATIONS)

This application claims the benefit of priority to Korean Patent Application No. 10-2018-0108164 filed on Sep. 11, 2018, in the Korean Intellectual Property Office, the disclosure of which is incorporated herein by reference in its entirety.

TECHNICAL FIELD

The present disclosure relates to an electronic component, and in particular to a multilayer capacitor.

BACKGROUND

A multilayer capacitor has been used as a component of various electronic devices due to advantages thereof such as compactness and high capacitance.

Such a multilayer capacitor includes a plurality of dielectric layers and internal electrodes, having different polarities, alternately laminated between the dielectric layers.

The dielectric layers have piezoelectric properties. Accordingly, when a DC or an AC voltage is applied to the multilayer capacitor, a piezoelectric phenomenon may occur between the internal electrodes to generate periodic vibrations while expanding and contracting a capacitor body.

During board mounting, vibrations may be transferred to a board through solders connecting external electrodes to the board. Thus, the entire board may serve as an acoustically reflective surface to generate vibratory sound as noise.

Vibratory sound may correspond to audio frequencies ranging from 20 Hz to 2000 Hz, causing listener discomfort. Such vibratory sound which may cause listener discomfort is known as acoustic noise.

To reduce acoustic noise, research into an electronic component using an interposer disposed between a multilayer capacitor and a board has been conducted.

However, in the case of a related-art electronic component using an interposer, an acoustic noise reducing effect may not be as effective as expected, or fixing strength may not be ensured during board mounting, resulting in poor mounting.

Accordingly, there is a need for a technique for securing a fixing strength of a predetermined level or higher, while effectively reducing acoustic noise of a multilayer capacitor.

SUMMARY

An aspect of the present disclosure is to provide an electronic component which may secure fixing strength while maintaining an acoustic noise reducing effect at a predetermined level or higher.

According to an aspect of the present disclosure, an electronic component includes a multilayer capacitor, including a capacitor body, and a pair of external electrodes disposed on both ends of the capacitor body, respectively and an interposer, including an interposer body, and a pair of external terminals disposed on both ends of the interposer body, respectively. The external terminals include bonding portions disposed on a top surface of the interposer body and connected to the external electrodes, mounting portions disposed on a bottom surface of the interposer body, and connection portions disposed on both end surfaces of the interposer body to connect the bonding portions and the mounting portions to each other. An adhesive is provided between the external electrodes and the bonding portions. The adhesive falls along the connection portions of the external terminals. When a height at which the adhesive falls along the connection portions of the external terminals is defined as t and a height of the interposer is defined as T, t/T satisfies $0.04 \le t/T \le 0.80$.

The height at which the adhesive falls along the connection portions of the external terminals may range from 0.02 millimeter to 0.40 millimeter.

The adhesive may be a high-melting point solder.

The high-melting point solder may include at least one of antimony (Sb), cadmium (Cd), lead (Pb), zinc (Zn), aluminum (Al), and copper (Cu).

The external terminals have "C"-shaped end portions, respectively.

The interposer body may be formed of alumina.

The capacitor body may have first and second surfaces disposed to face each other, third and fourth surfaces connected to the first and second surfaces and disposed to face each other, and fifth and six surfaces connected to the first and second surfaces and connected to the third and fourth surfaces and disposed to face each other, and may include a plurality of dielectric layers and a plurality of first and second internal electrodes alternately disposed with the dielectric layers interposed therebetween in a direction in which the fifth and sixth surfaces are connected to each other. One end of the first internal electrode and one end of the second internal electrode may be exposed through the third and fourth surfaces, respectively.

The external terminals may include head portions disposed on the third and fourth surfaces of the capacitor body, respectively, and band portions extending from the head portions and a portion of the first surface of the capacitor body.

The electronic component may further include a plating layer respectively provided on surfaces of the external electrodes and the external terminals.

The plating layers may include a nickel plating layer and a tin plating layer covering the nickel plating layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
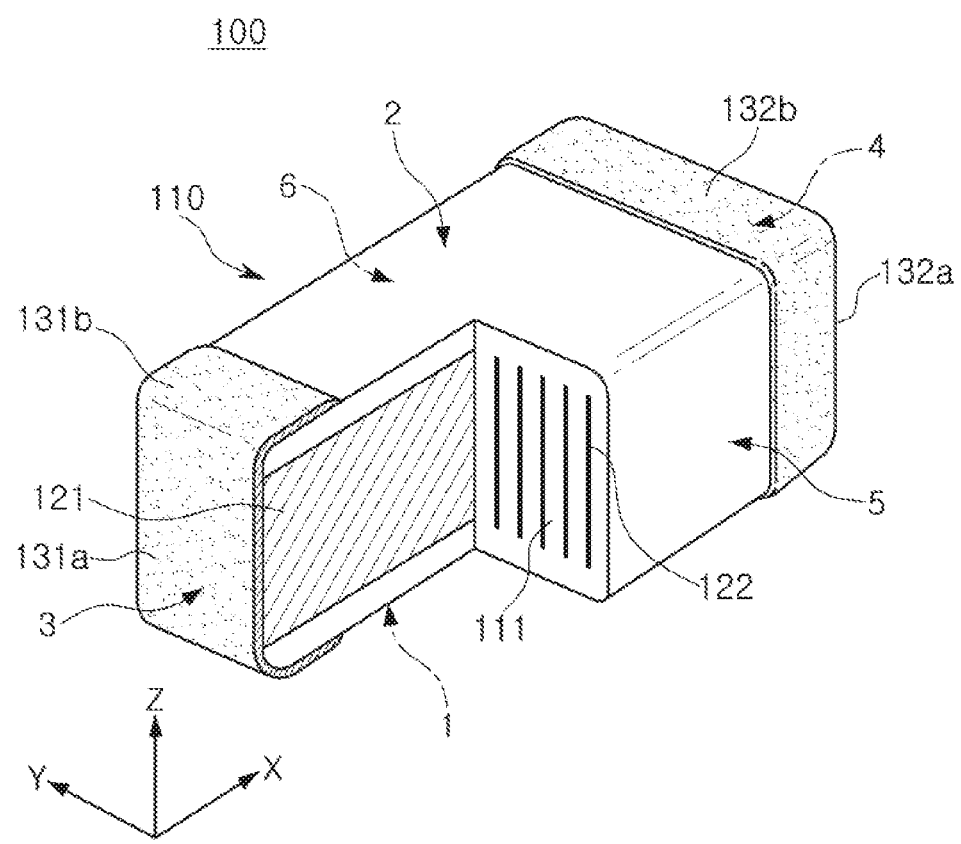
FIG. 1 is a partially cut-away perspective view of a multilayer capacitor applied to an electronic component, according to an exemplary embodiment in the present disclosure.

Hereinafter, embodiments in the present disclosure will be described as follows with reference to the attached drawings.

The present disclosure may, however, be embodied in many different forms and should not be construed as being limited to the embodiments set forth herein.

Rather, these embodiments are provided so that this disclosure will be thorough and complete, and will fully convey the scope of the present disclosure to those skilled in the art.

In the drawings, the shapes and dimensions of elements may be exaggerated for clarity, and the same reference numerals will be used throughout to designate the same or like components.

Also, elements having the same function, within a scope of the same concept illustrated in drawings of respective embodiments, will be described by using the same reference numerals.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

To clarify embodiments in the present disclosure, directions may be defined as follows: X, Y, and Z indicated in drawings denote a length direction, a width direction, and a thickness direction of a multilayer capacitor and an interposer, respectively.

In exemplary embodiments, the Y direction may be used to have the same concept as a lamination direction in which dielectric layers are laminated.

Figure 2A:
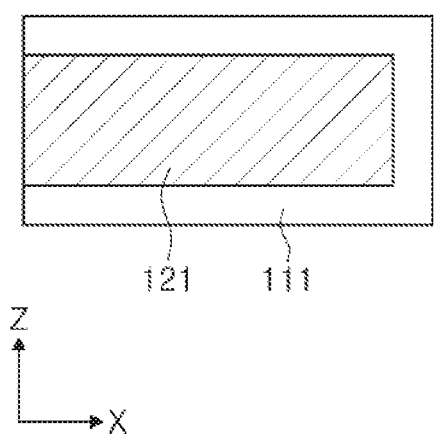
FIGS. 2A and 2B are plan views of first and second internal electrodes of the multilayer capacitor in FIG. 1, respectively.
Figure 2B:
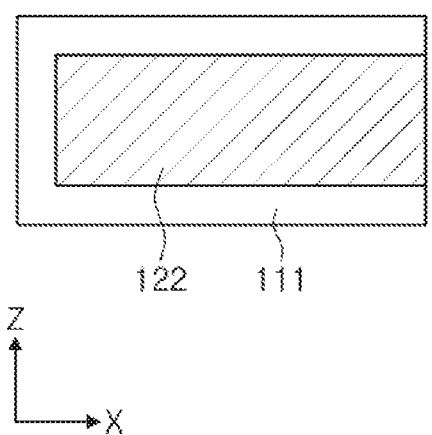

FIG. 1 is a partially cut-away perspective view of a multilayer capacitor applied to an electronic component according to an exemplary embodiment in the present disclosure, and FIGS. 2A and 2B are plan views of first and second internal electrodes of the multilayer capacitor in FIG. 1, respectively.

Hereinafter, a structure of a multilayer capacitor applied to an electronic component according to an exemplary embodiment will be described with reference to FIGS. 1 to 2B.

A multilayer capacitor 100 includes a capacitor body 110 and first and second external electrodes 131 and 132 disposed on both ends in X direction of the capacitor body 110, respectively.

The capacitor body 110 is formed by laminating a plurality of dielectric layers 111 in Y direction and sintering the laminated dielectric layers 111. Adjacent dielectric layers 111 may be integrated with each other such that boundaries therebetween may not be readily apparent without using a scanning electron microscope (SEM).

In addition, the capacitor body 110 includes a plurality of dielectric layers 111 and first and second internal electrodes 121 and 122 having different polarities alternately disposed in a Y direction with the dielectric layers 111 interposed therebetween.

The capacitor body 110 may include an active region as a portion contributing to formation of capacitance of the capacitor body 110 and cover regions as margin portions prepared in both side portions of the capacitor body 111 in Y direction and prepared in upper and lower portions of the active region in the Z direction, respectively.

The capacitor body 110 is not limited in shape, but may have a hexahedral shape. The capacitor body 110 may have first and second surfaces 1 and 2 disposed to oppose each other in the Z direction, third and fourth surfaces 3 and 4 connected to the first and second surfaces 1 and 2 and disposed to oppose each other in the X direction, and fifth and sixth surfaces 5 and 6 connected to the first and second surfaces 1 and 2 as well as the third and fourth surfaces 3 and 4 and disposed to oppose each other.

The dielectric layer 111 may include a ceramic powder, for example, a barium titanate ($BaTiO_3$)-based ceramic powder or the like.

The $BaTiO_3$-based ceramic powder may be $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ in which calcium (Ca) or zirconium (Zr) is partially employed in $BaTiO_3$, but a material of the ceramic powder is not limited thereto.

In addition to the ceramic powder, a ceramic additive, an organic solvent, a plasticizer, a binders, and a dispersant may be further added to the dielectric layer 111.

The ceramic additive may include, for example, a transition metal oxide or a transition metal carbide, a rare earth element, magnesium (Mg), aluminum (Al), or the like.

The first and second internal electrodes 121 and 122, as electrodes applied with different polarities, may be disposed on the dielectric layer 111 to be laminated in the Y direction. The first and second internal electrodes 121 and 122 may be alternately arranged to oppose each other with a single dielectric layer 111 interposed therebetween inside the capacitor body 110 in Y direction.

In this case, the first and second internal electrodes 121 and 122 may be electrically insulated from each other by the dielectric layer 111 disposed in the middle thereof.

While a structure in which internal electrodes are laminated in the Y direction has been described in the present disclosure, the present disclosure is not limited to the structure. If necessary, the present disclosure may be applied to a structure in which internal electrodes are laminated in the Z direction.

Ends of the first and second internal electrodes 121 and 122 may be exposed through the third and fourth surfaces 3 and 4 of the capacitor body 110, respectively.

The ends of the first and second electrodes 121 and 122 alternately exposed through the third and fourth surfaces 3 and 4 of the capacitor body 110 may be connected to the first and second external electrodes 131 and 132 disposed on both ends in the X direction of the capacitor body 110, which will be described later, to be electrically connected thereto, respectively.

According to the above-described configuration, charges are accumulated between the first and second internal electrodes 121 and 122 when a predetermined voltage is applied to the first and second external electrodes 131 and 132.

In this case, capacitance of the multilayer capacitor 100 may be proportional to an overlapping area between the first and second internal electrodes 121 and 122 overlapping each other in the active region in the Y direction.

The first and second inner electrodes 121 and 122 may be formed using a conductive paste formed of at least one of metal materials such as platinum (Pt), palladium (Pd), and a palladium-silver (Pd—Ag) alloy, nickel (Ni), and copper (Cu), but a material thereof is not limited thereto.

The conductive paste may be printed by means of a screen printing method, a gravure printing method, or the like, but the printing method is not limited thereto.

In the present embodiment, an internal electrode of the capacitor body 110 is shown as being laminated in a direction perpendicular to the first surface 1 which is a mounting surface. However, an internal electrode of the present disclosure may be laminated in a direction horizontal to the mounting surface, if necessary.

The first and second external electrodes 131 and 132 may be provided with voltages having different polarities and may be disposed on both ends in the X direction of the capacitor body 110. The first and second external electrodes 131 and 132 may be connected to exposed ends of the first and second internal electrodes 121 and 122, respectively, to be electrically connected to each other.

The first external electrode 131 may include a first head portion 131a and a first band portion 131b.

The first band portion 131b is disposed on the third surface 3 of the capacitor body 110 and is in contact with an end exposed outwardly of the first internal electrode 121 through the third surface 3 of the capacitor body to electrically connect the first internal electrode 121 to the first external electrode 131.

The first band portion 131b is a portion extending from the first head portion 131a to portions of the first, second, fifth, and sixth surfaces 1, 2, 5, and 6 of the capacitor body 110 to improve fixing strength or the like.

The second external electrode 132 may include a second head portion 132a and a second band portion 132b.

The second head portion 132a is disposed on the fourth surface 4 of the capacitor body 110 and is in contact with an end exposed outwardly of the second internal electrode 122 through the fourth surface 4 of the capacitor body 110 to electrically connect the second internal electrode 122 to the second external electrode 132.

The second band portion 132b is a portion extending from the head portion 132a to portions of the first, second, fifth, and sixth surfaces 1, 2, 5, and 6 of the capacitor body 110 to improve fixing strength or the like.

The first and second external electrodes 131 and 132 may further include plating layers.

The plating layers may include first and second nickel (Ni) plating layers and first and second tin (Sn) plating layers covering the first and second nickel plating layers, respectively.

Figure 3:
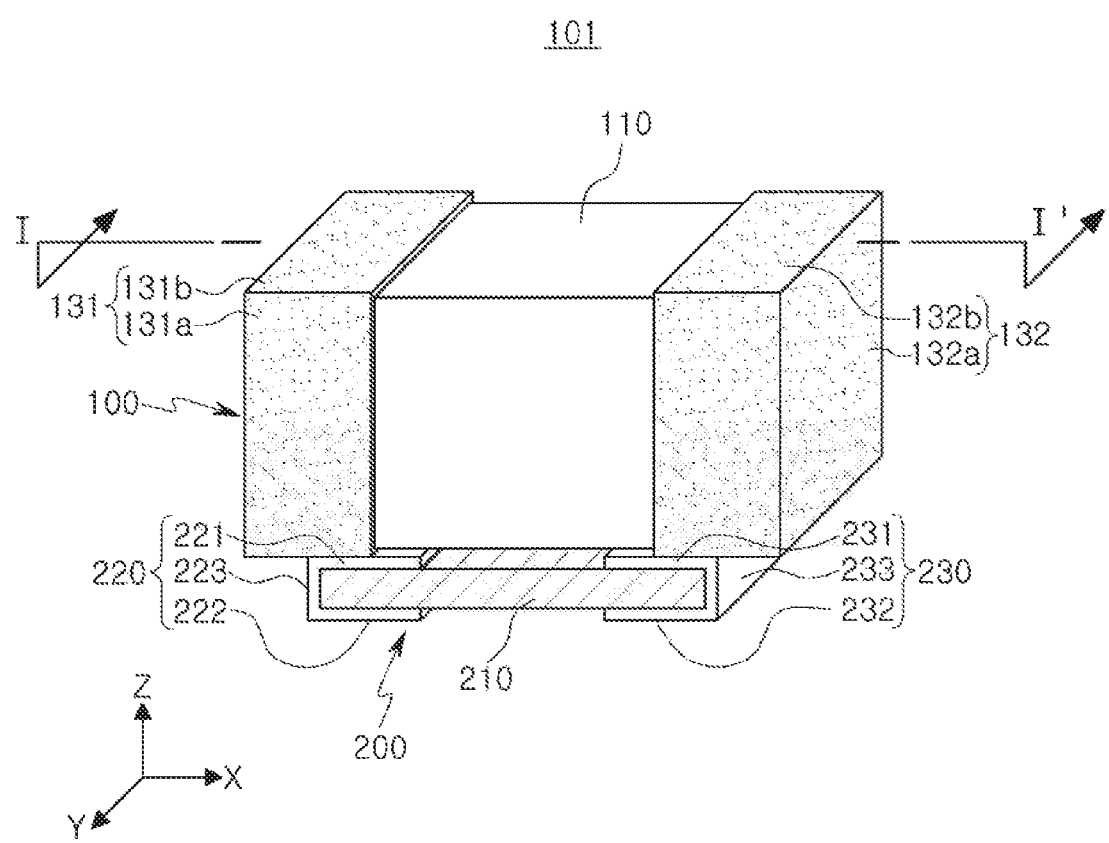
FIG. 3 is a perspective view of an electronic component according to an exemplary embodiment in the present disclosure.
Figure 4:
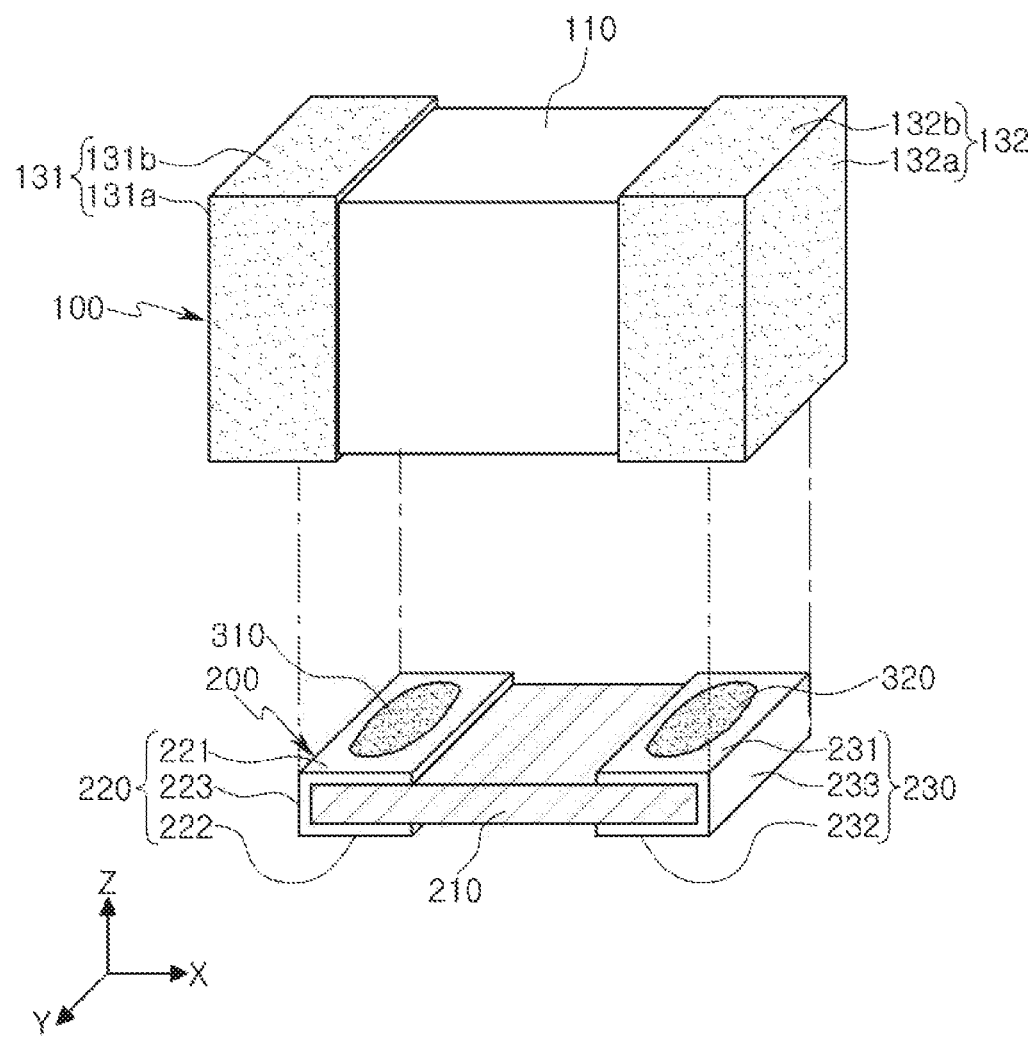
FIG. 4 is an exploded perspective view of FIG. 3.

FIG. 3 is a perspective view of an electronic component according to an exemplary embodiment in the present disclosure. FIG. 4 is an exploded perspective view of FIG. 3, while FIG. 5 is a cross-sectional view taken along line I-I' in FIG. 3.

Figure 5:
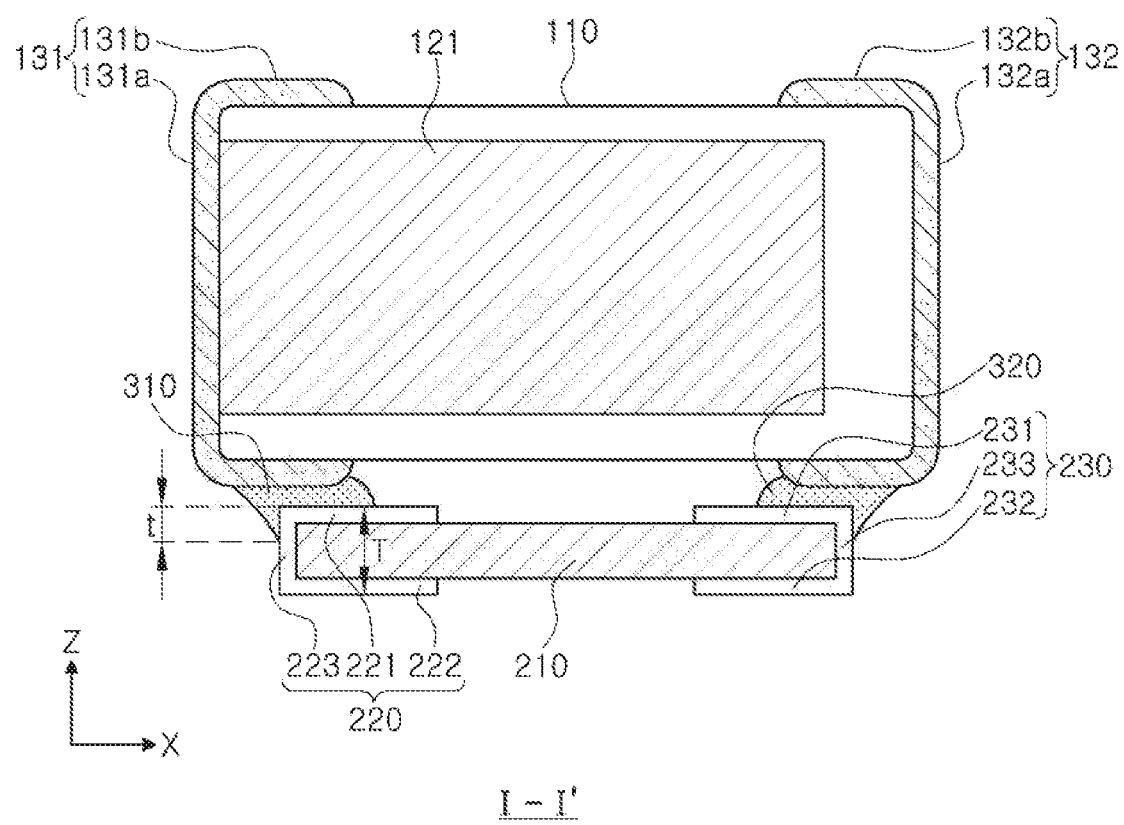
FIG. 5 is a cross-sectional view taken along line I-I' in FIG. 3.

Referring to FIGS. 3 to 5, an electronic component 101 includes a multilayer capacitor 100 and an interposer 200.

The interposer 200 includes an interposer body 210 and first and second external terminals 220 and 230 disposed on both end portions in an X direction of the interposer body 210, respectively.

The X-directional length and the Y-directional width of the interposer body 210 may be equal to or less than an X-directional length and a Y-directional width of the capacitor body 110, respectively. For example, the interposer 200 may have an X-directional length of 2.0 millimeters (mm) and a Y-directional width of 1.2 mm.

The interposer body 210 may be formed of ceramic, in detail, alumina ($Al_2O_3$).

The first and second external terminals 220 and 230 may be provided with voltages having different polarities and may be connected to first and second band portions 131b and 132b of the first and second external electrodes 131 and 132, respectively, to be connected to each other.

The first external terminal 220 includes a first bonding portion 221, a first mounting portion 222, and a first connection portion 223.

The first bonding portion 221 is a portion disposed on a top surface of the interposer body 210, and has one end exposed through one surface of the interposer body 210 in the X direction and connected to the first band portion 131b of the first external terminal 131.

The first mounting portion 222 is a portion disposed on a bottom surface of the interposer body 210 to face the first bonding portion 221 in a Z direction and may serve as a terminal during board mounting.

The first connection portion 223 may be disposed on one end surface of the interposer body 210 in the X direction and serves to connect an end portion of the first bonding portion 221 and an end portion of the first mounting portion 222 to each other.

Accordingly, the first external terminal 220 may be provided to have a C-shaped X-Z end portion.

A first adhesive 310 may be provided between the first bonding portion 221 and the first band portion 131b to bond the first bonding portion 221 and the first band portion 131b to each other.

The first adhesive 310 may be formed of a high-melting point solder or the like.

The high-melting point solder may include at least one or more of antimony (Sb), cadmium (Cd), lead (Pb), zinc (Zn), aluminum (Al), and copper (Cu).

The first adhesive 310 is disposed to extend to a portion of the first connection portion 223. When a height at which the first adhesive 310 falls along the first connection portion 223 of the first external terminal 220 of the interposer 200 is defined as t and a height of the interposer 200 is defined as T, t/T may satisfy $0.04 \leq t/T \leq 0.80$.

The second external terminal 230 may include a second bonding portion 231, a second mounting portion 232, and a second connection portion 233.

The second bonding portion 232 is a portion disposed on the top surface of the interposer body 210 and has one end exposed through the other surface of the interposer body 210 in the X direction and connected to the second band portion 132b of the second external electrode 132.

The second mounting portion 232 is a portion disposed on the bottom surface of the interposer body 210 to face the second bonding portion 231 of the interposer body 210 in the Z direction and may serve to a terminal during board mounting.

The second connection portion 233 is disposed on the other end surface of the interposer body 210 in the X direction and servs to connect an end portion of the second bonding portion 231 and an end portion of the second mounting portion 232 to each other.

Accordingly, the second external terminal 230 may be provided to have a C-shaped (or a mirrored C-shaped) X-Z end portion.

A second adhesive 320 is provided between the second boding portion 231 and the second band portion 132b to bond the second boding portion 231 and the second band portion 132b to each other.

The second adhesive 320 may be formed of a high-melting point solder or the like.

The second adhesive 320 is disposed to extend to a portion of the second connection portion 233. When a height at which the second adhesive 320 falls along the second connection portion 233 of the second external terminal 230 of the interposer 200 is defined as t and the height of the interposer 200 is defined as T, t/T may satisfy $0.04 \leq t/T \leq 0.80$.

The height t at which the second adhesive 320 falls along the second connection portion 233 of the second external terminal 230 of the interposer 200 may range from 0.02 mm to 0.04 mm.

If necessary, a plating layer may be further provided on surfaces of the first and second external terminals 220 and 230.

The plating layer may include a nickel plating layer and a tin plating layer covering the nickel plating layer.

When the first and second external electrode 131 and 132 disposed in the electronic component 100 are applied with voltages having different polarities while the electronic component 100 is mounted on a board, the capacitor body 110 is expanded and contracted in the Z direction by an inverse piezoelectric effect of the dielectric layer 111.

Accordingly, both end portions of the first and second external electrodes 131 and 132 are contracted and expanded by the Poisson effect, contrary to the expansion and contraction in the Z direction of the capacitor body 110, which results in the generation of vibrations.

The vibrations are transferred to the board through the first and second external electrodes 131 and 132 and the first and second external terminals 220 and 230. Thus, an acoustic sound is radiated from the board to cause acoustic noise.

The interposer 200 according to an exemplary embodiment may be attached to a first surface side, which is a mounting direction of the multilayer capacitor 100, to prevent the vibration of the multilayer capacitor 100 from being transferred to the board. Thus, the acoustic noise of the multilayer capacitor 100 may be reduced.

In detail, the multilayer capacitor 100 is bonded to the interposer 200 while being laminated in such a manner that the internal electrodes are perpendicular to a mounting surface of the interposer 200. Therefore, an effect of preventing the vibration from being transferred from the multilayer capacitor 100 to the board may be improved to further reduce the acoustic noise.

In an exemplary embodiment, a multilayer capacitor and an interposer are bonded to each other by an adhesive formed of a high-melting point solder.

The smaller the amount of the high-melting point solder, the smaller a bonding area of the multilayer capacitor and the interposer. Therefore, vibrations transferred from the multilayer capacitor to the board may be reduced more effectively.

However, the smaller the bonding area of the multilayer capacitor and the interposer, the lower the fixing strength. Accordingly, there is an increased possibility that the multilayer capacitor and the interposer may be unexpectedly separated from each other.

Moreover, in the case in which the amount of the high-melting point solder is significantly high, the amount of a solder used to mount a board may be limited, while the high-melting point solder falls along a connection portion of an external terminal. Thus, fixing strength to the board may be reduced.

Accordingly, it is necessary to find the amount of the high-melting point solder which may effectively reduce acoustic noise of the electronic component and may secure sufficient fixing strength between the multilayer capacitor and the interposer and the amount of a typical solder.

In the present embodiment, such a suitable amount of the adhesive is limited to a length at which the adhesive falls from an upper end of an external terminal of the interposer along the connection portion.

Experimental Example

Figure 6:
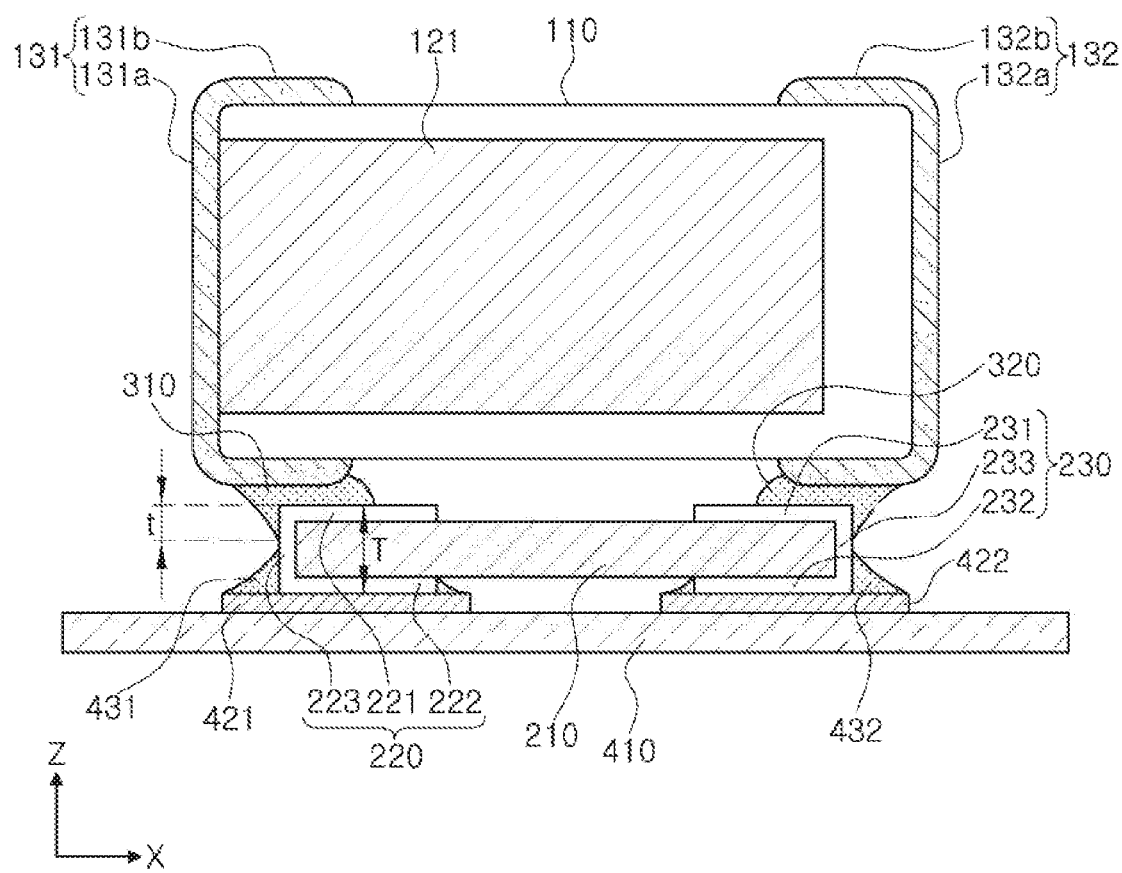
FIG. 6 is a cross-sectional view illustrating a state in which the electronic component in FIG. 3 is mounted on a board.

FIG. 6 is a cross-sectional view illustrating a state in which the electronic component in FIG. 3 is mounted on a board.

In FIG. 6, reference numeral 410 denotes a board, reference numerals 421 and 422 denote first and second land patterns on which first and second mounting portions 222 and 232 of first and second external terminals 220 and 230 are mounted, respectively, a reference numeral 431 denotes a solder provided to bond the external terminal 220 and the first land pattern 421 to each other, and a reference numeral 432 denotes a solder provided to bond the second external terminal 230 and the second land pattern 432 to each other.

Figure 7:
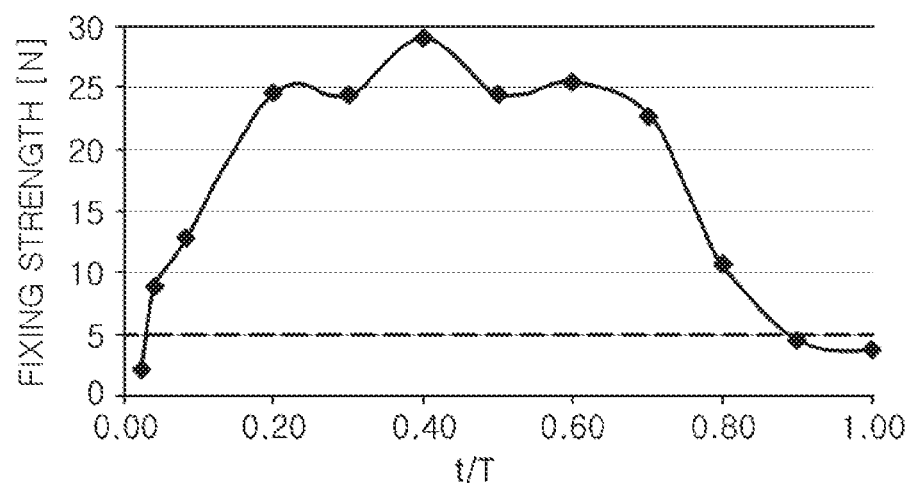
FIG. 7 is a graph illustrating fixing strength of an electronic component depending on a ratio of a height of an interposer to a height at which a bonding body falls along a connection portion of an external terminal.

Table (1) and FIG. 7 illustrate fixing strength of an electronic component depending on a ratio of a height of the interposer 200 to a height at which the adhesive 310/320 falls along the connection portion 223/233 of the external terminal 220/230 of the interposer 200.

A multilayer capacitor 100 used in each sample is fabricated to have an X-directional length of 2.0 mm, a Y-directional width of 1.2 mm, and a capacitance of 22 microfarads (pF).

An interposer 200 used in each sample is fabricated to have an X-directional length of 1.7 mm, a Y-directional length of 1.2 mm, and a Z-directional thickness of 0.5 mm.

The multilayer capacitor 100 and the interposer 200 are bonded to each other using adhesives 310 and 320 formed of a high-melting point solder to be fabricated as electronic components, and are mounted on a board 410 to test fixing strength. In this case, the amount of the high-melting point solder that is the adhesives 310 and 320 is variously changed for each sample.

The amounts of the high-melting point solder used for each sample may be compared with each other by obtaining a height t, at which the adhesives 310 and 320 fall along a first connection portion of a first external terminal 220 or a second connection portion 223 of a second external terminal 230, using an X-Z cross-sectional image of an electronic component.

The fixing strength may be confirmed by strength at the moment at which the electronic component is separated from the board 410 or the multilayer capacitor 100 and the interposer 200 are separated from each other by increasingly applying force to one surface X-Z of the mounted electronic component.

In Table (1) and FIG. 7, T denotes a height of the interposer 200 and t denotes a height at which the adhesives 310 and 320 fall along the first connection portion of the first external terminal 220 or the second connection portion 223 of the second external terminal 230.

In destruction positions of the fixing strength, 'Upper' is a case in which the external electrodes 131 and 132 and the external terminals 220 and 230 are first separated from each other, and 'Lower' is a case in which the external terminals 220 and 230 and the land patterns 421 and 422 of the board 410 are first separated from each other.

Strength of the fixing strength represents strength at the moment when destruction occurs either in 'Upper' or 'Lower.' In results of the fixing strength, a case in which destruction occurs at strength less than 5 N is determined as 'NG.'

TABLE (1)

| | | | Fixing Strength | |
| --- | --- | --- | --- | --- |
| # | t (mm) | t/T | Strength (N) | Result | Destruction Position |
| 1 | 0.01 | 0.02 | 2.1 | NG | Upper |
| 2 | 0.02 | 0.04 | 8.9 | OK | Upper |
| 3 | 0.04 | 0.08 | 12.8 | OK | Upper |
| 4 | 0.10 | 0.20 | 24.6 | OK | Upper |
| 5 | 0.15 | 0.30 | 24.4 | OK | Upper |
| 6 | 0.20 | 0.40 | 29.1 | OK | Lower |
| 7 | 0.25 | 0.50 | 24.5 | OK | Lower |
| 8 | 0.30 | 0.60 | 25.4 | OK | Lower |
| 9 | 0.35 | 0.70 | 22.7 | OK | Lower |
| 10 | 0.40 | 0.80 | 10.8 | OK | Lower |
| 11 | 0.45 | 0.90 | 4.6 | NG | Lower |
| 12 | 0.50 | 1.00 | 3.8 | NG | Lower |

Referring to Table (1), in the case of a sample 1 in which t/T was less than 0.04, fixing strength between an external electrode and an external terminal was not sufficiently secured. As a result, an upper side of the electronic component was destroyed at strength of 2.1 N.

In the case of samples 11 and 12 in which t/T was greater than 0.80 and t was greater than 0.04 mm, heights of the adhesives 310 and 320 were so great that heights of the solders 431 and 432 were relatively small. Accordingly, fixing strength between an external electrode and an external terminal was not sufficiently secured. As a result, a lower side of the electronic component was destroyed at strengths of 4.6 N and 3.8 N.

Accordingly, it can be seen that to secure the fixing strength between the external electrodes 131 and 132 and the external terminals 220 and 230 to a predetermined level or higher, t should range from 0.02 mm to 0.40 mm and t/T should satisfy $0.04 \leq t/T \leq 0.80$.

According to an exemplary embodiment, fixing strength of a predetermined level or higher may be secured during board mounting while maintaining an acoustic noise reducing effect at a predetermined level or higher. Thus, poor mounting may be prevented.

While exemplary embodiments have been shown and described above, it will be apparent to those skilled in the art that modifications and variations could be made without departing from the scope of the present invention as defined by the appended claims.

What is claimed is:

1. An electronic component comprising:
   a multilayer capacitor, including a capacitor body, and a pair of external electrodes disposed on both ends of the capacitor body in a length direction, respectively; and
   an interposer, including an interposer body, and a pair of external terminals disposed on both ends of the interposer body in the length direction, respectively, the interposer being disposed below the multilayer capacitor in a height direction,
   wherein the external terminals include bonding portions disposed on a top surface of the interposer body and connected to the external electrodes, mounting portions disposed on a bottom surface of the interposer body, and connection portions disposed on both end surfaces of the interposer body to connect the bonding portions and the mounting portions to each other, an adhesive is provided between the external electrodes and the bonding portions, and the adhesive falls along the connection portions of the external terminals and satisfies $0.04 \leq t/T \leq 0.80$, wherein t is a height at which the adhesive falls along the connection portions of the external terminals and T is a height of the interposer.

2. The electronic component of claim 1, wherein the height t at which the adhesive falls along the connection portions of the external terminals ranges from 0.02 millimeter to 0.40 millimeter.

3. The electronic component of claim 1, wherein the adhesive is a high-melting point solder.

4. The electronic component of claim 3, wherein the high-melting point solder includes at least one of antimony (Sb), cadmium (Cd), lead (Pb), zinc (Zn), aluminum (Al), and copper (Cu).

5. The electronic component of claim 1, wherein the external terminals have C-shaped end portions.

6. The electronic component of claim 1, wherein the interposer body comprises alumina.

7. The electronic component of claim 1, wherein the capacitor body has first and second surfaces disposed to face each other in the height direction, third and fourth surfaces connected to the first and second surfaces and disposed to face each other in the length direction, and fifth and six surfaces connected to the first and second surfaces, connected to the third and fourth surfaces, and disposed to face each other in a width direction, and includes a plurality of dielectric layers and a plurality of first and second internal electrodes alternately disposed with the dielectric layers interposed therebetween in the width direction, and one end of the first internal electrode and one end of the second internal electrode are exposed through the third and fourth surfaces, respectively.

8. The electronic component of claim 7, wherein the external electrodes include:

head portions disposed on the third and fourth surfaces of the capacitor body, respectively; and band portions extending from the head portions to portions of the first surface of the capacitor body.

9. The electronic component of claim 1, further comprising:

a plating layer respectively provided on surfaces of the external electrodes and the external terminals.

10. The electronic component of claim 9, wherein the plating layer includes a nickel plating layer and a tin plating layer covering the nickel plating layer.

11. An electronic component comprising:

a multilayer capacitor having a body and a pair of external electrodes disposed on end surfaces of the body opposing each other in a length direction;

an interposer disposed below the multilayer capacitor in a height direction, the interposer comprising an interposer body, and a pair of external terminals, each of the external terminals comprising a connecting portion covering a corresponding end surface of the interposer body, and a bonding portion and a mounting portion respectively covering a corresponding portion of a top surface and a bottom surface of the interposer body, the bonding portion and the mounting portion being physically connected to the connecting portion; and an adhesive disposed on each bonding portion and connecting each external electrode to a corresponding external terminal, and falling along a corresponding connecting portion, wherein $0.04 \leq t/T \leq 0.80$, t being a height at which the adhesive falls along the connection portions of the external terminals and T being a height of the interposer.

12. The electronic component of claim 11, wherein the interposer body comprises alumina.

13. The electronic component of claim 11, wherein a length of the multilayer capacitor is greater than the length of the interposer.

14. The electronic component of claim 11, wherein the multilayer capacitor comprises first internal electrodes disposed on dielectric layers and contacting a first of the pair of external electrodes, and second internal electrodes disposed on dielectric layers between adjacent first internal electrodes and contacting a second of the pair of external electrodes, the dielectric layers being stacked in a width direction perpendicular to the height direction.

15. The electronic component of claim 11, wherein the adhesive comprises a high-melting point solder.

16. An electronic component comprising:

a multilayer capacitor comprising first internal electrodes disposed on dielectric layers and contacting a first external electrode, and second internal electrodes disposed on dielectric layers between adjacent first internal electrodes and contacting a second external electrode, the dielectric layers being stacked in a width direction and forming a body of the multilayer capacitor, the first and second external electrodes being disposed on end surfaces of the body opposing in a length direction perpendicular to the width direction;

an interposer disposed below the multilayer capacitor in a height direction, the interposer comprising an interposer body and C-shaped external terminals covering opposite end surfaces of the interposer body and on corresponding portions of top and bottom surfaces of the interposer body, the external terminals being spaced apart from each other; and an adhesive connecting corresponding external electrodes to external terminals disposed on portions of external terminals covering the top surfaces and the end surfaces of the interposer body, wherein $0.04 \leq t/T \leq 0.80$, t being a height at which the adhesive falls along the portions of external terminals covering the end surfaces of the interposer body, and T being a height of the interposer.

17. The electronic component of claim 16, wherein the adhesive includes at least one of antimony (Sb), cadmium (Cd), lead (Pb), zinc (Zn), aluminum (Al), and copper (Cu).

18. The electronic component of claim 16, wherein the interposer body comprises alumina.

19. The electronic component of claim 16, wherein the external electrodes and the external terminals each comprise a plurality of layers including a plating layer comprising a nickel plating layer and a tin plating layer covering the nickel plating layer.

* * * * *